US012572495B2

(12) United States Patent
Tiwari et al.

(10) Patent No.: US 12,572,495 B2
(45) Date of Patent: Mar. 10, 2026

(54) PVT COMPENSATED SLOW TRANSITION SERIAL INTERFACE IO TRANSMITTER WITH REDUCED DELAY

(71) Applicant: STMicroelectronics International N.V., Geneva (CH)

(72) Inventors: Manoj Kumar Tiwari, Unnao (IN); Paras Garg, Noida (IN); Sandeep Kaushik, Greater Noida (IN); Adarsh Kumar Singh, Gorakhpur (IN)

(73) Assignee: STMicroelectronics International N.V., Geneva (CH)

( * ) Notice: Subject to any disclaimer, the term of this patent is extended or adjusted under 35 U.S.C. 154(b) by 0 days.

(21) Appl. No.: 18/788,862

(22) Filed: Jul. 30, 2024

(65) Prior Publication Data

US 2025/0117350 A1 Apr. 10, 2025

Related U.S. Application Data

(60) Provisional application No. 63/543,380, filed on Oct. 10, 2023.

(51) Int. Cl.
*G06F 13/40* (2006.01)
*G06F 13/42* (2006.01)
*H03K 17/687* (2006.01)

(52) U.S. Cl.
CPC ...... *G06F 13/4072* (2013.01); *G06F 13/4282* (2013.01); *H03K 17/6871* (2013.01)

(58) Field of Classification Search
CPC ............ G06F 13/4072; G06F 13/4282; H03K 17/6871
See application file for complete search history.

(56) References Cited

U.S. PATENT DOCUMENTS

| | | | | |
|---|---|---|---|---|
| 5,428,303 A * | 6/1995 | Pasqualini | ....... | H03K 19/00361 326/29 |
| 6,600,346 B1 * | 7/2003 | Macaluso | ............. | H04L 25/028 327/108 |
| 7,728,630 B1 | 6/2010 | Ren et al. | | |
| 2006/0114037 A1 | 6/2006 | Ajit | | |

(Continued)

OTHER PUBLICATIONS

Ker et al., "Design of 2×VDD-Tolerant I/O Buffer With PVT Compensation Realized by Only 1×VDD Thin-Oxide Devices," in IEEE Transactions on Circuits and Systems I: Regular Papers, vol. 60, No. 10, pp. 2549-2560, (Oct. 2013).

*Primary Examiner* — Phong H Dang
(74) *Attorney, Agent, or Firm* — Alston & Bird LLP

(57) ABSTRACT

Systems, apparatuses, and methods for serial peripheral interfaces are provided, particularly for PVT compensated serial peripheral interfaces with slow transition serial interface IO transmitter with reduced delay. The serial peripheral interfaces may include driver circuitry, pre-driver circuitry, PVT compensated current sink circuitry, and PVT compensated current source circuit. The PVT compensated current sink circuitry and PVT compensated current source circuit may generate and transmit signals compensating for PVT to the pre-driver circuitry, which may generate and transmit signals controlling IO data signals generated by the driver circuitry. The IO data signals generated may be compensated for process, voltage, and temperature. The compensation may provide IO data signals with slower transition times and with reduced delays.

20 Claims, 9 Drawing Sheets

(56)            References Cited

U.S. PATENT DOCUMENTS

2008/0212385 A1 *  9/2008  Mueller ................... H03K 5/12
                                              327/170
2009/0091358 A1     4/2009  Chauhan et al.
2013/0027092 A1 *  1/2013  Bien ............. H03K 19/017509
                                              327/109
2013/0250703 A1     9/2013  Matsuoka
2017/0237427 A1 *  8/2017  Zella .................... H03K 17/687
                                              327/108
2022/0337243 A1    10/2022  Evani et al.

* cited by examiner

PVT COMPENSATED SLOW TRANSITION SERIAL INTERFACE IO TRANSMITTER WITH REDUCED DELAY

CROSS REFERENCE TO RELATED APPLICATIONS

This application claims priority to U.S. Provisional Patent Application No. 63/543,380 filed on Oct. 10, 2023, which is incorporated herein by reference in its entirety.

TECHNOLOGICAL FIELD

Example embodiments of the present disclosure relate generally to serial peripheral interfaces, particularly PVT compensated serial peripheral interfaces with slow transition serial interface IO transmitter.

BACKGROUND

A Serial Peripheral Interface (SPI) is a serial interface used for data communication. SPIs are used in a myriad of applications, including mobile devices. A SPI has a transmit (Tx) and receive (Rx) function for respectively transmitting and receiving input and output at an input/output terminal (IO). The SPI may have requirements for signals, including rise and fall times for a signal. Improvements in rise and fall times and associated spreads of rise and fall times are needed, particularly in view of capacitive load ranges used by IOs.

New SPI transmitters are needed. The inventors have identified numerous areas of improvement in the existing technologies and processes, which are the subjects of embodiments described herein. Through applied effort, ingenuity, and innovation, many of these deficiencies, challenges, and problems have been solved by developing solutions that are included in embodiments of the present disclosure, some examples of which are described in detail herein.

BRIEF SUMMARY

Various embodiments described herein relate to systems, apparatuses, and methods for serial peripheral interfaces.

In accordance with some embodiments of the present disclosure, an example serial peripheral interface is provided. The serial peripheral interface may comprise: a driver circuitry comprising a P-driver circuitry and a N-driver circuitry; wherein the P-driver circuitry comprises a first PMOSFET electrically connected to a voltage supply at a source of the first PMOSFET and to a first terminal of a first resistor and a first terminal of a first capacitor at a drain of the first PMOSFET, wherein a second terminal of the first capacitor is electrically connected to a gate of the first PMOSFET; wherein the N-driver circuitry comprises a first NMOSFET electrically connected to a first terminal of a second resistor and a first terminal of second capacitor at a source of the first NMOSFET and to a ground at a drain of the first NMOSFET, wherein a second terminal of the second capacitor is electrically connected to a gate of the first NMOSFET; wherein the second terminal of the first resistor is electrically connected to a second terminal of the second resistor and an input/output terminal; a pre-driver circuitry comprising P-pre-driver circuitry electrically connected to the gate of the first PMOSFET and a N-pre-driver circuitry electrically connected to the gate of the first NMOSFET, wherein the P-pre-driver circuitry is configured to generate a first PD signal and to transmit the first PD signal to the gate of the first PMOSFET, wherein the N-pre-driver circuitry is configured to generate a first ND signal and to provide the first ND signal to the gate of the NMOSFET; a PVT compensated current sink circuitry electrically connected to the P-pre-driver circuitry; and a PVT compensated current source circuit electrically connected to the N-pre-driver circuitry.

In accordance with some embodiments of the present disclosure, an example apparatus is provided. The apparatus comprising: a serial peripheral interface comprising: a driver circuitry comprising a P-driver circuitry and a N-driver circuitry; wherein the P-driver circuitry comprises a first PMOSFET electrically connected to a voltage supply at a source of the first PMOSFET and to a first terminal of a first resistor and a first terminal of a first capacitor at a drain of the first PMOSFET, wherein a second terminal of the first capacitor is electrically connected to a gate of the first PMOSFET; wherein the N-driver circuitry comprises a first NMOSFET electrically connected to a first terminal of a second resistor and a first terminal of second capacitor at a source of the first NMOSFET and to a ground at a drain of the first NMOSFET, wherein a second terminal of the second capacitor is electrically connected to a gate of the first NMOSFET; wherein the second terminal of the first resistor is electrically connected to a second terminal of the second resistor and an input/output terminal; a pre-driver circuitry comprising P-pre-driver circuitry electrically connected to the gate of the first PMOSFET and a N-pre-driver circuitry electrically connected to the gate of the first NMOSFET, wherein the P-pre-driver circuitry is configured to generate a first PD signal and to transmit the first PD signal to the gate of the first PMOSFET, wherein the N-pre-driver circuitry is configured to generate a first ND signal and to provide the first ND signal to the gate of the NMOSFET; a PVT compensated current sink circuitry electrically connected to the P-pre-driver circuitry; a PVT compensated current source circuit electrically connected to the N-pre-driver circuitry; and a processor configured to enable and to disable the PVT compensated current sink circuitry and the PVT compensated current source circuitry.

In some embodiments, the PVT compensated current sink circuitry is configured to general a first current, wherein the P-pre-driver circuitry is configured to generate a second current that is equal to the first current.

In some embodiments, the first PD signal is generated based at least on the second current.

In some embodiments, the PVT compensated current source circuitry is configured to general a third current, wherein the N-pre-driver circuitry is configured to generate a fourth current that is equal to the third current.

In some embodiments, the first ND signal is generated based at least on the fourth current.

In some embodiments the PVT compensated current sink circuitry is configured to receive a first enable signal to control a first switch to enable the PVT compensated current sink circuitry; and the PVT compensated current source circuitry is configured to receive a second enable signal to control a second switch to enable the PVT compensated current source circuitry.

In some embodiments, the PVT compensated current sink circuitry is configured to generate a first current with a higher current value when a voltage of a voltage supply increases.

In accordance with some embodiments of the present disclosure, an example method of operating a circuit having a serial peripheral interface is provided. The method may comprise: providing a serial peripheral interface comprising: a driver circuitry comprising a P-driver circuitry and a N-driver circuitry; wherein the P-driver circuitry comprises a first PMOSFET electrically connected to a voltage supply at a source of the first PMOSFET and to a first terminal of a first resistor and a first terminal of a first capacitor at a drain of the first PMOSFET, wherein a second terminal of the first capacitor is electrically connected to a gate of the first PMOSFET; wherein the N-driver circuitry comprises a first NMOSFET electrically connected to a first terminal of a second resistor and a first terminal of second capacitor at a source of the first NMOSFET and to a ground at a drain of the first NMOSFET, wherein a second terminal of the second capacitor is electrically connected to a gate of the first NMOSFET; wherein the second terminal of the first resistor is electrically connected to a second terminal of the second resistor and an input/output terminal; a pre-driver circuitry comprising P-pre-driver circuitry electrically connected to the gate of the first PMOSFET and a N-pre-driver circuitry electrically connected to the gate of the first NMOSFET; a PVT compensated current sink circuitry electrically connected to the P-pre-driver circuitry; a PVT compensated current source circuit electrically connected to the N-pre-driver circuitry; generating, by the P-pre-driver circuitry and based at least on a first enable signal, a first PD signal; generating, by the N-pre-driver circuitry and based at least on a second enable signal, a first ND signal; and generating, by the driver circuitry and based on the first PD signal and the first ND signal, a first input/output signal at the input/output terminal.

In some embodiments, the method further comprises: generating, by the PVT compensated current sink circuitry, a first current; generating, by the P-pre-driver circuitry, a second current that is equal to the first current; and wherein the first PD signal is generated based at least on the second current.

In some embodiments, the method further comprises generating, by the PVT compensated current source circuitry, a third current; generating, by the N-pre-driver circuitry, a fourth current that is equal to the third current; and wherein the first ND signal is generated based at least on the fourth current.

In some embodiments, generating the first current is based at least on a compensation for a change in process.

In some embodiments, generating the first current is based at least on a compensation for a change in voltage.

In some embodiments, generating the first current is based at least on a compensation for a change in temperature.

The above summary is provided merely for purposes of summarizing some example embodiments to provide a basic understanding of some aspects of the disclosure. Accordingly, it will be appreciated that the above-described embodiments are merely examples and should not be construed to narrow the scope or spirit of the disclosure in any way. It will also be appreciated that the scope of the disclosure encompasses many potential embodiments in addition to those here summarized, some of which will be further described below.

BRIEF SUMMARY OF THE DRAWINGS

Having thus described certain example embodiments of the present disclosure in general terms, reference will now be made to the accompanying drawings, which are not necessarily drawn to scale, and wherein:

4

Figure 1A:
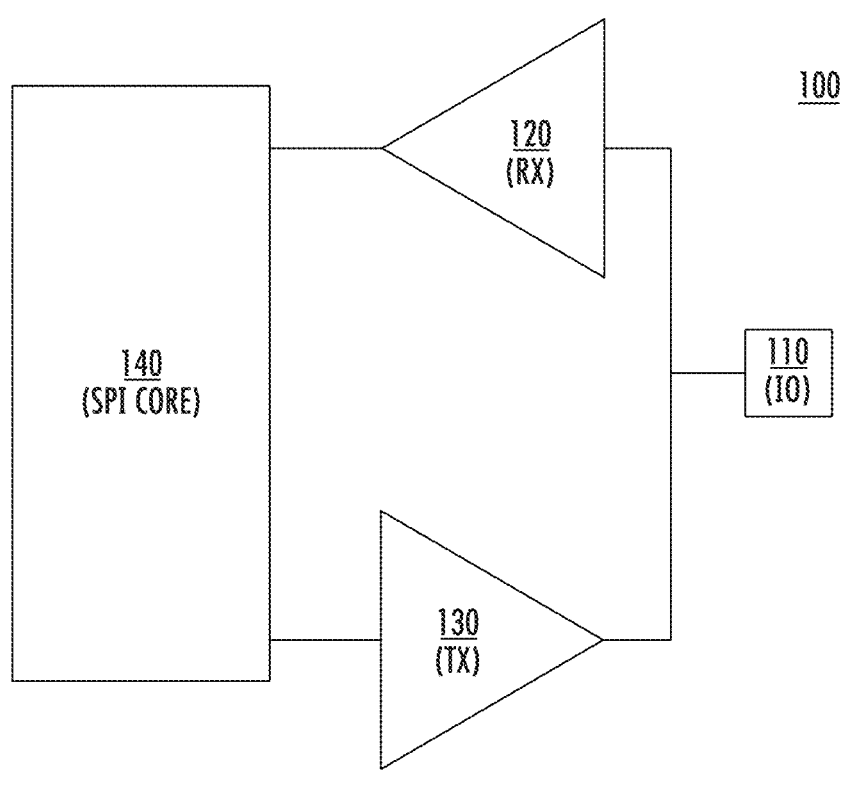
Figure 1B:
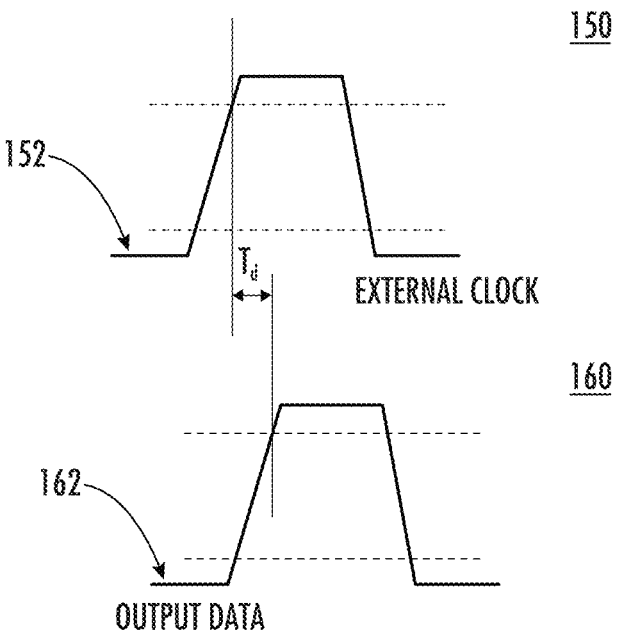
Figure 2:
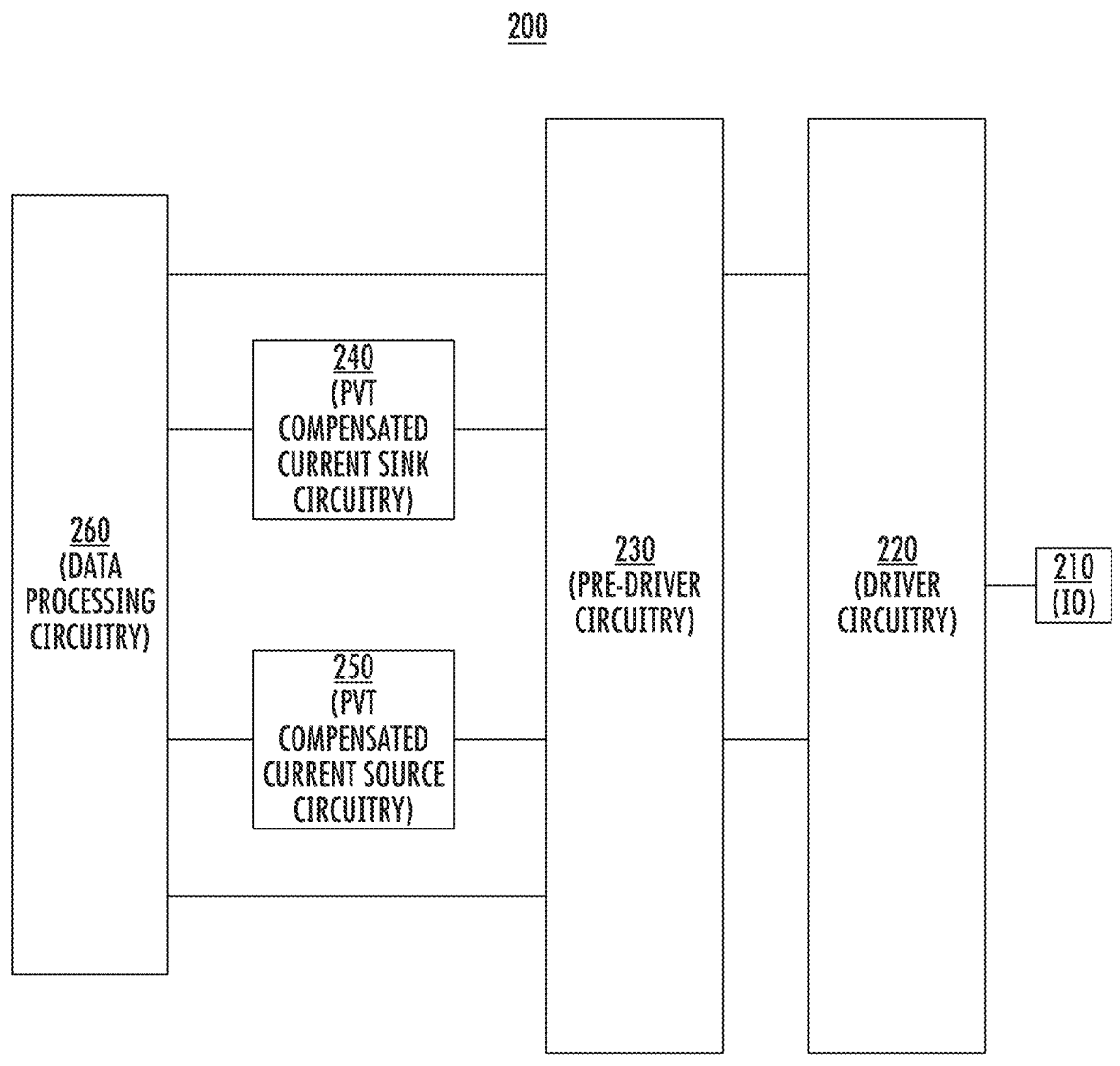
Figure 3:
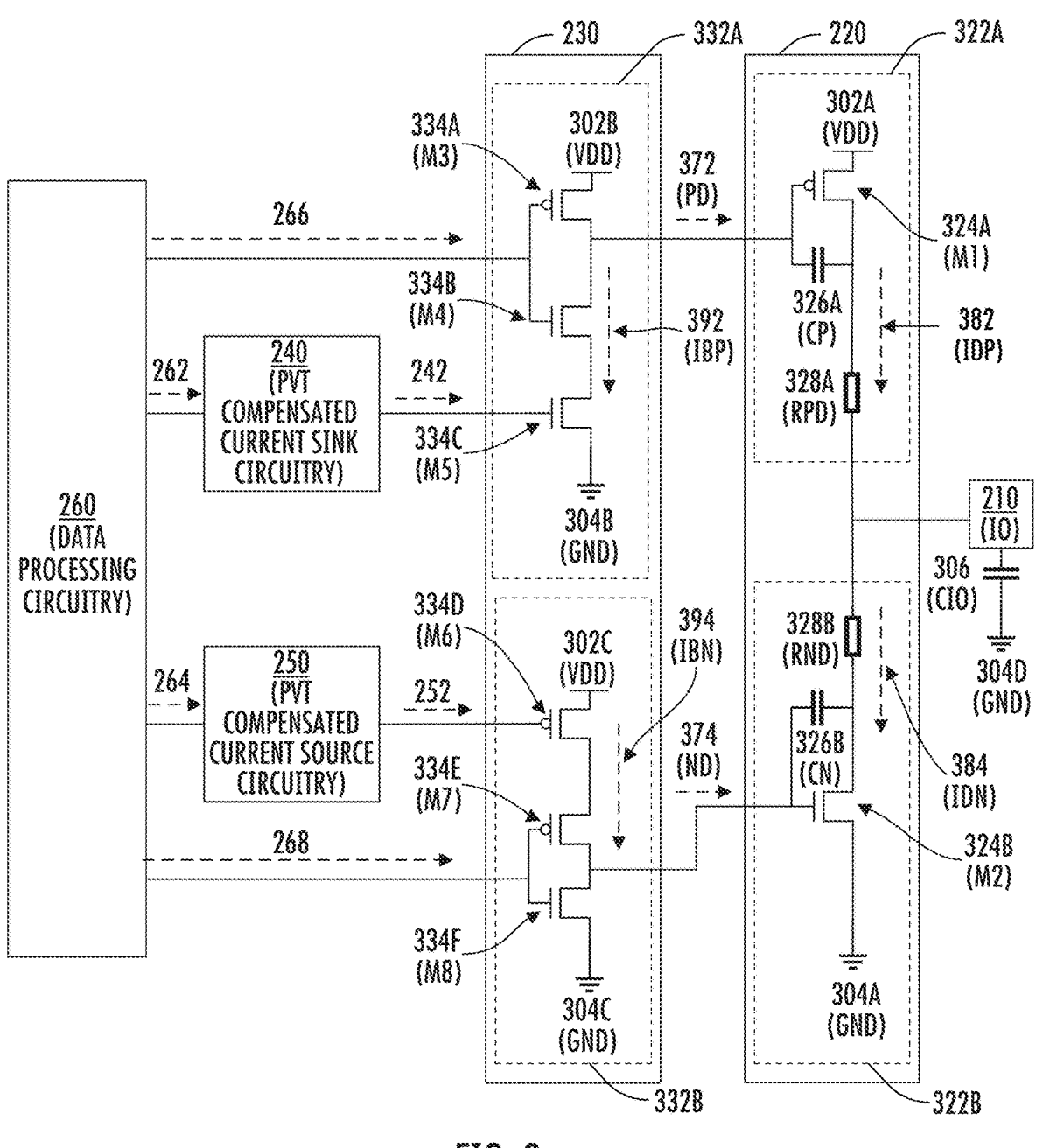
Figures 4A, 4B:
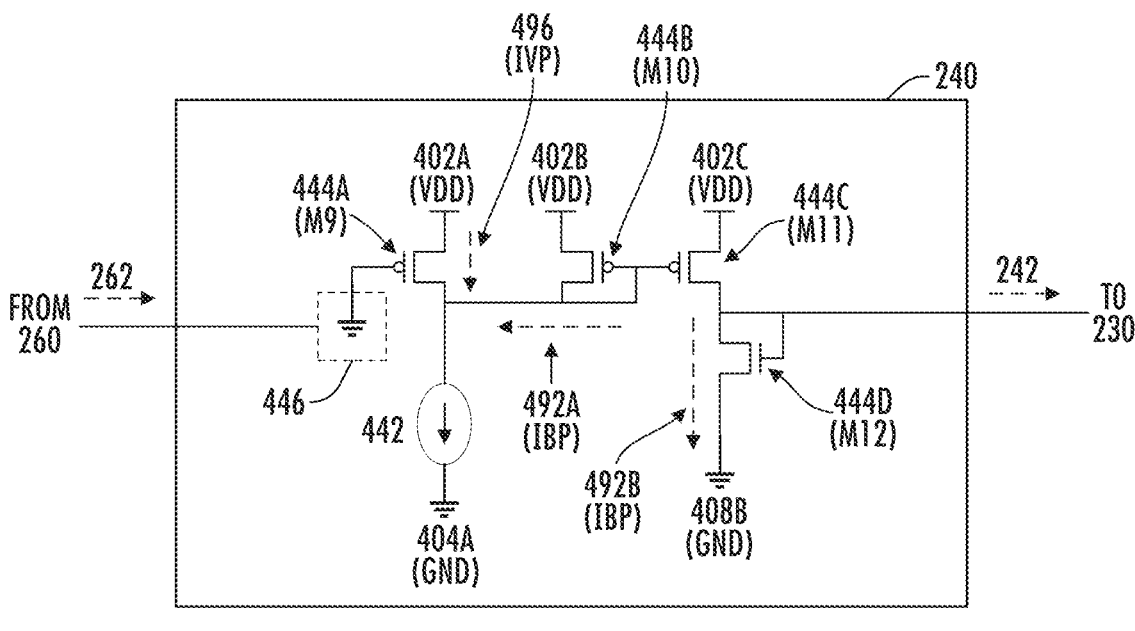
Figure 5:
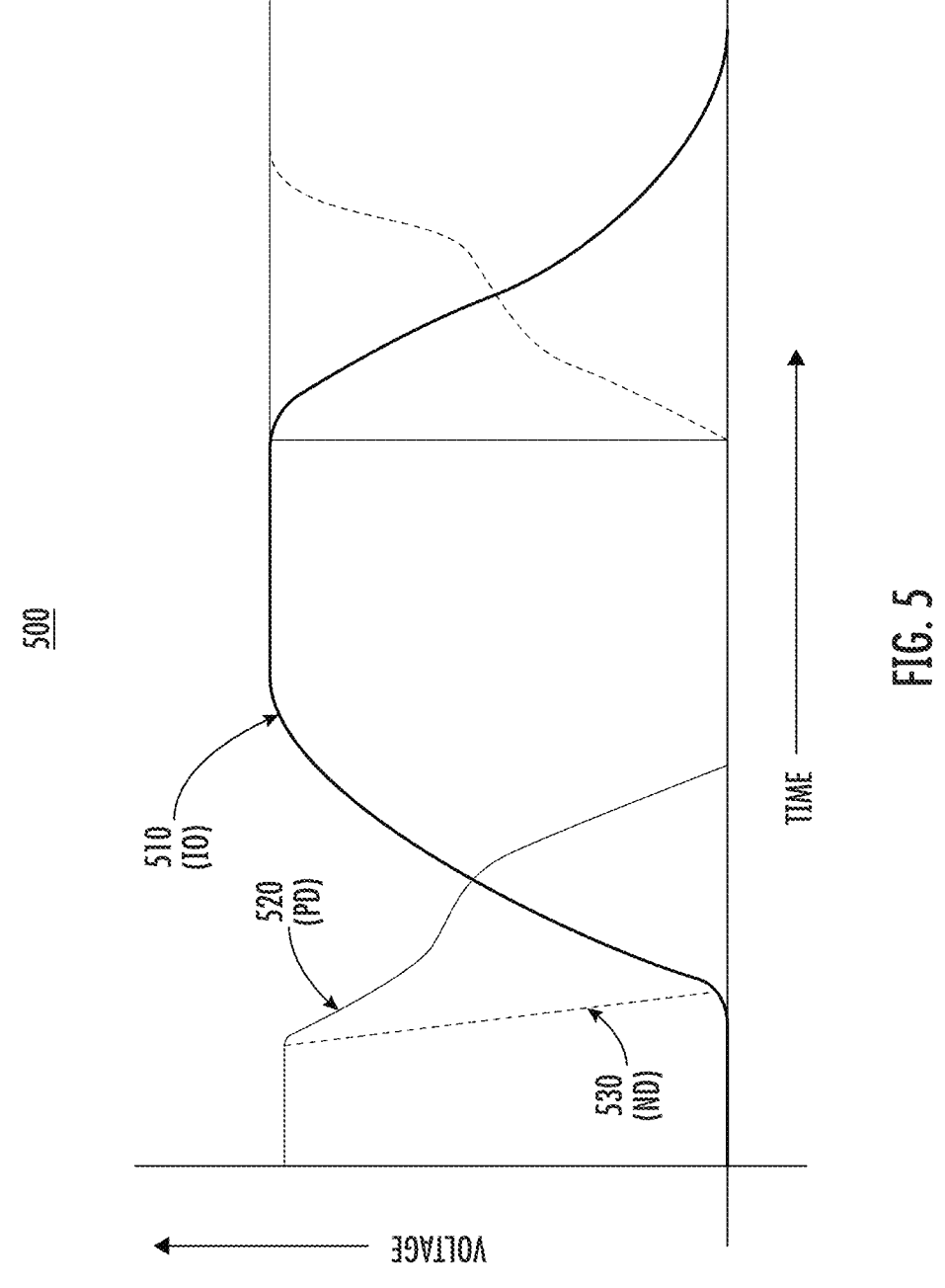
Figure 6A:
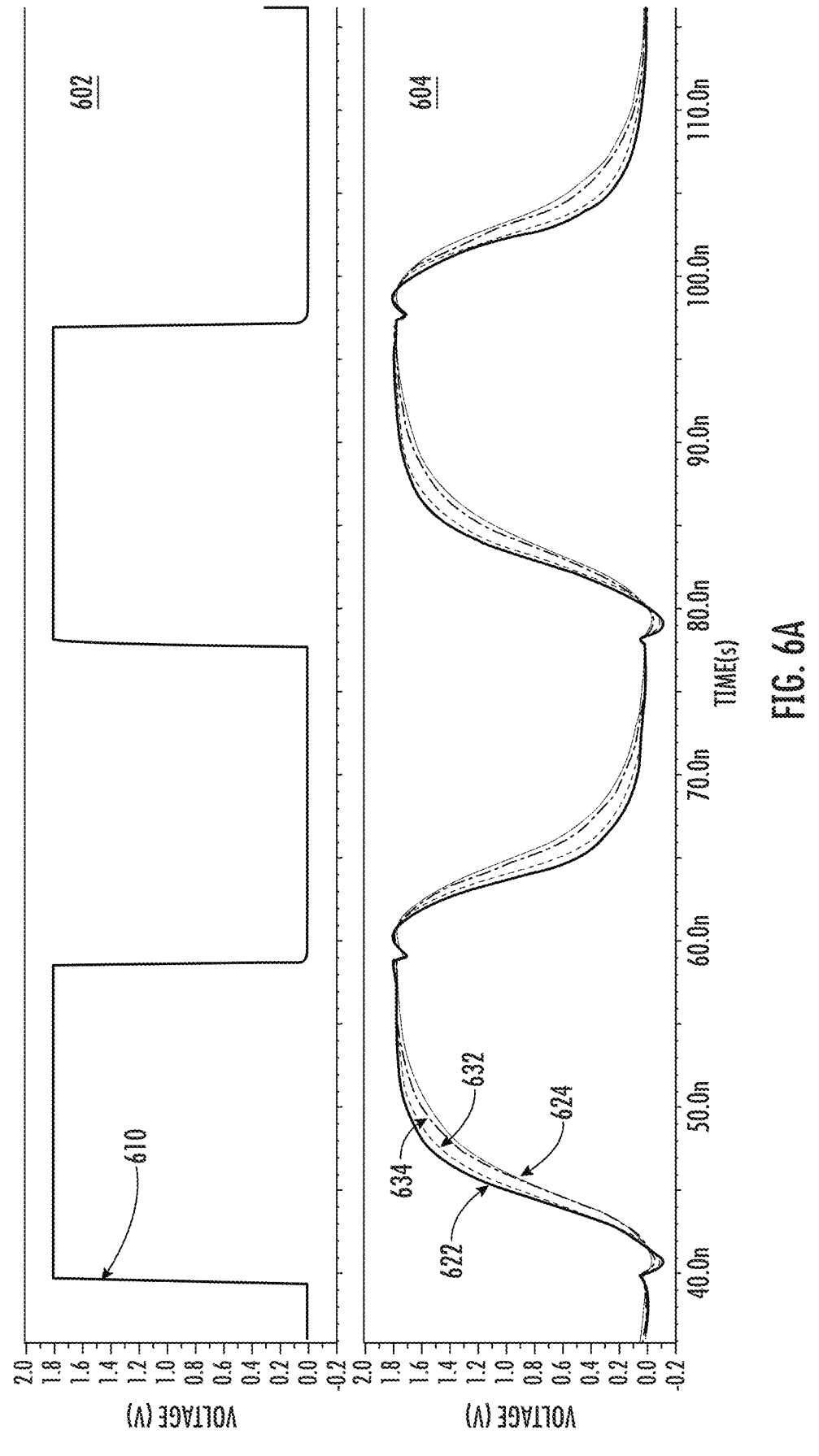
Figure 6B:
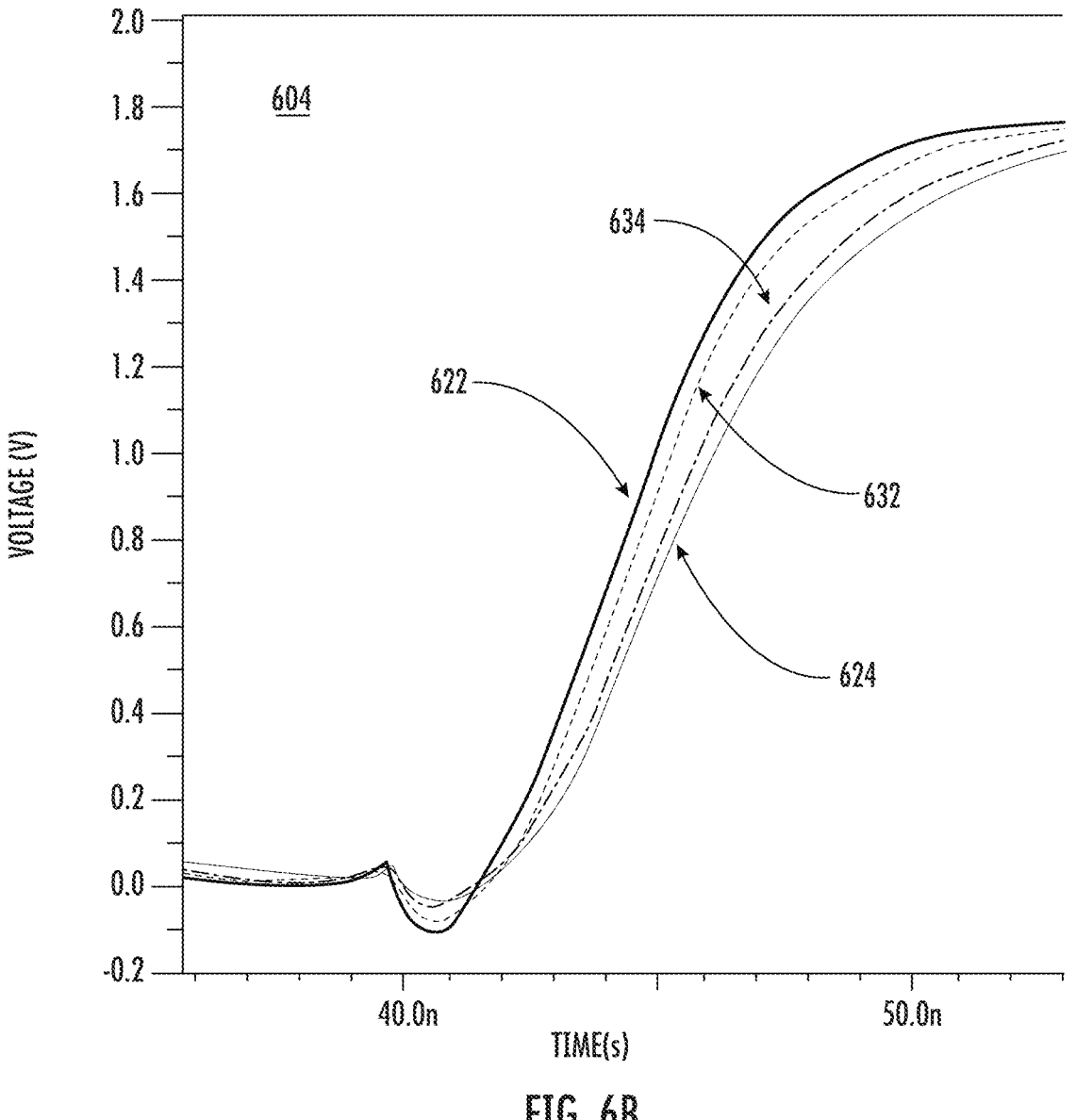
Figure 7:
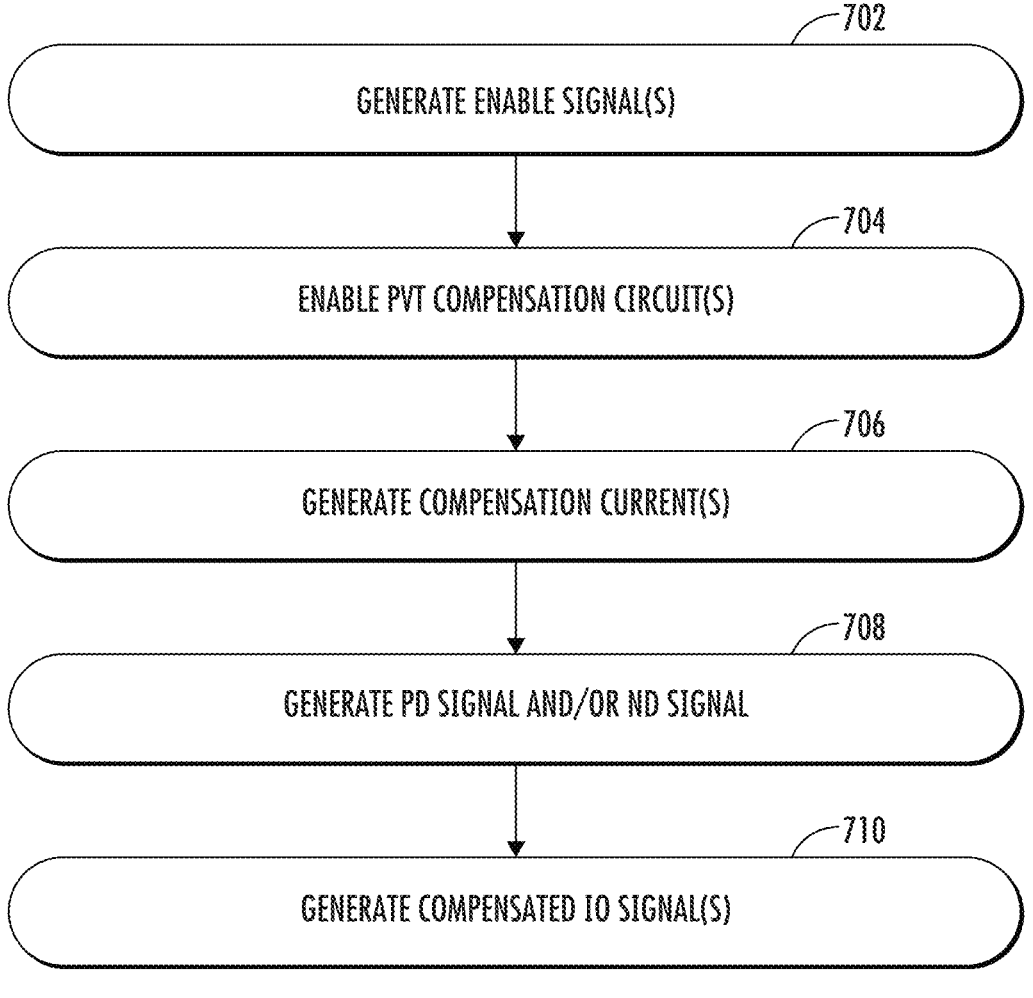
Figure 8:
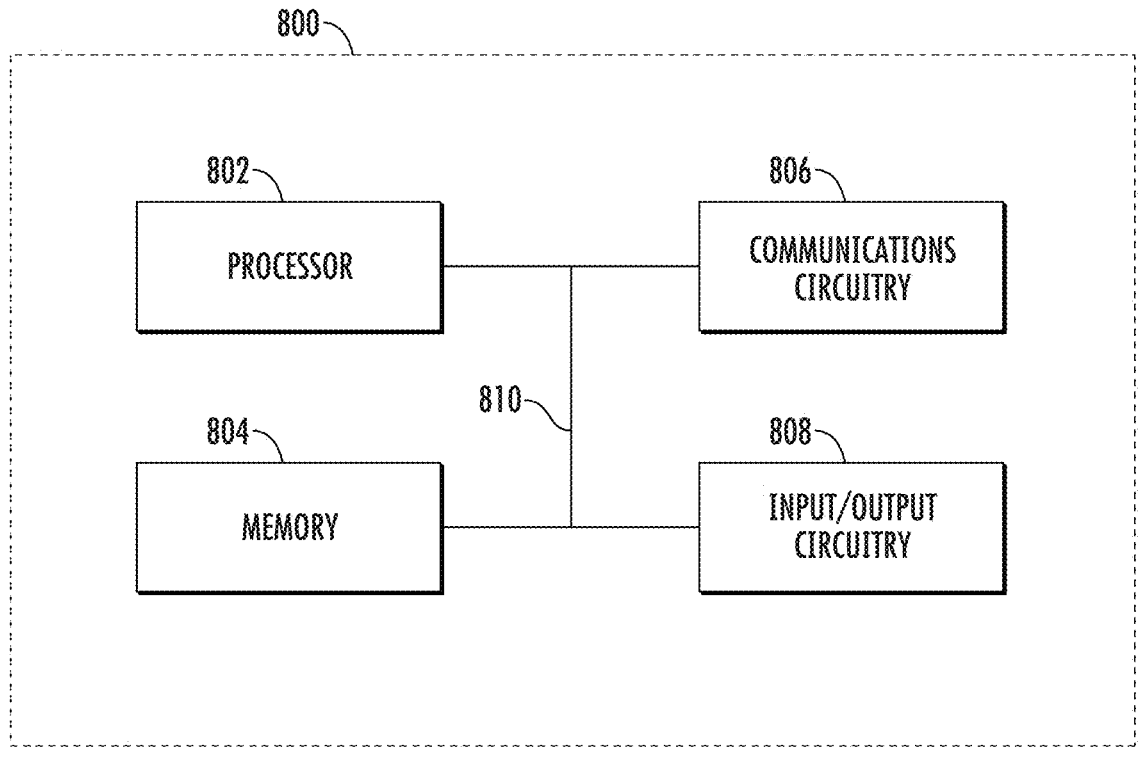

FIG. 1A illustrates a block diagram of a serial peripheral interface in accordance with one or more embodiments of the present disclosure;

FIG. 1B illustrates example graphs of IO signals in accordance with one or more embodiments of the present disclosure;

FIG. 2 illustrates a block diagram of a transmitter of a serial peripheral in accordance with one or more embodiments of the present disclosure;

FIG. 3 illustrates a block diagram of a transmitter of a serial peripheral in accordance with one or more embodiments of the present disclosure;

FIG. 4A illustrates a block diagram of a PVT compensated current sink circuitry in accordance with one or more embodiments of the present disclosure;

FIG. 4B illustrates a block diagram of a PVT compensated current sink circuitry in accordance with one or more embodiments of the present disclosure;

FIG. 5 illustrates a graph of an example IO signal in accordance with one or more embodiments of the present disclosure;

FIG. 6A illustrates a graph of an example signals in accordance with one or more embodiments of the present disclosure;

FIG. 6B illustrates an enlargement of a graph of an example signals in accordance with one or more embodiments of the present disclosure;

FIG. 7 illustrates a flowchart that includes example methods for operating an SPI in accordance with one or more embodiments of the present disclosure; and FIG. 8 illustrates an example block diagram of a system or apparatus in accordance with one or more embodiments of the present disclosure.

DETAILED DESCRIPTION

Some embodiments of the present disclosure will now be described more fully herein with reference to the accompanying drawings, in which some, but not all, embodiments of the disclosure are shown. Indeed, various embodiments of the disclosure may be embodied in many different forms and should not be construed as limited to the embodiments set forth herein; rather, these embodiments are provided so that this disclosure will satisfy applicable legal requirements. Like reference numerals refer to like elements throughout.

As used herein, the term "comprising" means including but not limited to and should be interpreted in the manner it is typically used in the patent context. Use of broader terms such as comprises, includes, and having should be understood to provide support for narrower terms such as consisting of, consisting essentially of, and comprised substantially of.

The phrases "in various embodiments," "in one embodiment," "according to one embodiment," "in some embodiments," and the like generally mean that the particular feature, structure, or characteristic following the phrase may be included in at least one embodiment of the present disclosure and may be included in more than one embodiment of the present disclosure (importantly, such phrases do not necessarily refer to the same embodiment).

The word "example" or "exemplary" is used herein to mean "serving as an example, instance, or illustration." Any implementation described herein as "exemplary" is not necessarily to be construed as preferred or advantageous over other implementations.

If the specification states a component or feature "may," "can," "could," "should," "would," "preferably," "possibly,"

"typically," "optionally," "for example," "often," or "might" (or other such language) be included or have a characteristic, that a specific component or feature is not required to be included or to have the characteristic. Such a component or feature may be optionally included in some embodiments or it may be excluded.

The use of the term "circuitry" as used herein with respect to components of a system or an apparatus should be understood to include particular hardware configured to perform the functions associated with the particular circuitry as described herein. The term "circuitry" should be understood broadly to include hardware (e.g., electrical components and the like) and, in some embodiments, software for configuring the hardware. For example, in some embodiments, "circuitry" may include processing circuitry, communications circuitry, input/output circuitry, and the like. In some embodiments, other elements may provide or supplement the functionality of particular circuitry.

Overview

The present disclosure is for systems, apparatuses, and methods for PVT compensated slow transition serial interface IO transmitter with reduced delay. In various embodiments, the circuits described herein provide current modulation for voltage mode IO to reduce output delays with independent control on output rise/fall time by PVT compensated circuits. PVT refers to process, voltage, temperature.

FIG. 1A illustrates a block diagram of a serial peripheral in accordance with one or more embodiments of the present disclosure. A SPI 100 is used for a serial interface for data communication. A SPI communicates with an input/output (IO) 110, which may be an IO terminal, via a receiver (RX) 120 and a transmitter (Tx) 130. The SPI 100 may provide bidirectional communication over the serial interface between a system or apparatus incorporating the SPI 100, which includes an SPI core 140, and an external device connected via an IO 110. The receiver 120 may receive data from the IO 110 and transmit the data to the SPI core 140. The transmitter may receive data from the SPI core 140 and transmit the data to the IO 110. In various embodiments, the IO 110 may be an IO pad or terminal. The SPI core 140 may include various hardware and/or software to control the SPI, including performance of one or more operations of the receiver 120 and the transmitter 130. The signals transmitted from the IO 110 and to the IO 110 have rise and fall times.

FIG. 1B illustrates example graphs of IO signals in accordance with one or more embodiments of the present disclosure. The example graphs of FIG. 1B include a receive graph 150 and a transmit graph 160. The receive graph 150 illustrates a signal 152 received via receiver 120, which may be an external clock signal. The transmit graph 160 illustrates a signal transmitter via transmitter 130. The received signal may include an external clock signal 152. The transmitter signal may include a transmitted output data signal 162.

As illustrated in FIG. 1B, both the external clock signal 152 and the output data signal 162 have a rise and a fall. As also illustrated in FIG. 1B, a measurement between the rise of the external clock signal 152 and an analogous point on the rise of the output data signal 162 is measured as Td. In various embodiments, Td may be referred to as a delay. This time delay Td may be a function of a loop delay. A loop delay may be the time taken to receive data (e.g., receiver delay of the receiver 120), process data (e.g., digital code logic delay in the SPI core 140), and transmit data (e.g., transmitter delay of the transmitter 130).

SPI interfaces 100 may be required to comply with one or more standards. These standards may require certain speeds for various signals, which may place requirements on the time delay Td. For example, a SPI may require that a loop delay have a minimum and maximum time. As well, a transmitter delay may have a minimum and maximum time. However, high speed devices may have a loop delay in a range of acceptable times, and this may be associated with a transmitter delay range that requires a slower transition time for reduced transmitter delay.

A transmitter 130 of a SPI 100 may include programmable driver settings for resistor based drivers that may decrease process spread. The programmable driver settings may allow for adjustment of, for example, capacitance load to adjust time delays. These programmable drivers may introduce higher spreads through the use of MOSFETs and registers. For example, the MOSFETs may have a spread of 60 to 70% while the registers may have a spread of 25%.

Various embodiments of the present disclosure may allow for a single setting that allows for wide capacitance load range at the IO 110, and this may allow for the minimum rise and falls times for transitions may be improved without needing to adjust driver settings. Various embodiments may reduce the spread by, among other things, providing PVT compensation as described herein. The PVT compensation may reduce the need for programmable drivers and/or registers and allow for compensation for PVT without requiring the programming to manage load and drive settings. Thus the PVT compensation may allow for not knowing an exact load (e.g., capacitance of an IO 110, which may be between 10 pF and 50 pF) and providing a single setting that address the range of loads.

Various embodiment of the present disclosure may improve in rise/fall times and associated spreads. Additionally or alternatively, various embodiments of the present disclosure may improve SPI 100 by slowing a transmitter transition time, which may allow for longer transmission lines to be used with the SPI.

FIG. 2 illustrates a block diagram of a transmitter of a serial peripheral in accordance with one or more embodiments of the present disclosure. The SPI 200 of FIG. 2 includes an IO 210, driver circuitry 220, pre-driver circuitry 230, PVT compensated current sink circuitry 240, PVT compensated current source circuitry 250, and data processing circuitry 260. As illustrated, the driver circuitry 220 is electrically connected to the IO 210. The pre-driver circuitry 230 is electrically connected to the driver circuitry 220, the PVT compensated current sink circuitry 240, PVT compensated current source circuitry 250, and data processing circuitry 260. The PVT compensated current sink circuitry 240 and PVT compensated current source circuitry 250 are each electrically connected to the data processing circuitry 260.

The PVT compensated current sink circuitry 240 and PVT compensated current source circuitry 250 each provide a respectively signal to the pre-driver-circuitry 230 that compensates for process, voltage, and/or temperature. As described further herein, the PVT compensated current sink circuitry 240 includes a current sink and the PVT compensated current source circuitry 250 includes a current source.

FIG. 3 illustrates a block diagram of a transmitter of a serial peripheral in accordance with one or more embodiments of the present disclosure.

The capacitance of each of the driver capacitors, which are capacitor (CP) 326A and of capacitor (CN) 326B, compensate and/or control the IO rise/fall times based on the capacitance of the IO load, which is illustrated as capacitor (CIO) 306. The PVT compensation circuits (e.g., 240, 250) provide compensation to reduce the spread of the driver capacitors charging and discharging and, thus, rise/fall time associated with capacitance of the IO load. Each PVT compensation circuit is associated with one of the particular driver capacitors. The PVT compensation current sink circuitry 240 is associated with driver capacitor of capacitor (CP) 326A. The PVT compensation current source circuitry 250 is associated with driver capacitor of capacitor (CP) 326B. Each PVT compensation circuit and associated capacitor provide control to slow and/or speed up the rise/fall times of the IO signal. This includes, for example, slowing transitions of the IO signal to IO 210. Additionally or alternatively, in various embodiments the load capacitance, illustrated as capacitor (CIO) 306, may vary or range from 10 pF to 50 pF, and the delay and transition times of the IO signals are maintained over this range of capacitances. The PVT compensation circuits may allow for compensating the driver 220 to meet required time delays over such ranges of capacitances.

As is illustrated in FIG. 3, the driver circuitry 220 includes P-driver circuitry 322A and a N-driver circuitry 322B. In various embodiments, the P-driver circuitry may be referred to as high logic and the N-driver circuitry may be referred to as low logic. The high logic of the SPI 100 may use one or more PMOSFETs and the low logic may use one or more NMOSFETs. The PMOSFET and NMOSFET of the driver circuitry 220 may be controlled by signals from pre-driver circuitry 230.

The P-driver circuitry 322A includes at least a PMOSFET (M1) 324A, a capacitor (CP) 326A, and a resistor (RPD) 328A. The gate of the PMOSFET (M1) 324A is electrically connected to a voltage source (VDD) 302A. The drain of the PMOSFET (M1) is electrically connected to a first terminal of capacitor (CP) 326A and a first terminal of a resistor (RPD) 328A. The gate of the PMOSFET (M1) 324A is electrically connected to a second terminal of the capacitor (CP) 326A and the P-Pre-driver circuitry 332A, particularly the drain of the PMOSFET (M3). In operation, a first current (IDP) 382 may flow through resistor (RPD) 328A when, among other things, the PMOSFET (M1) 324A is conducting.

The N-driver includes at least a NMOSFET (M2) 324B, a capacitor (CN) 326B, and a resistor (NPD) 328B. The source of the NMOSFET (M2) is electrically connected to a second terminal of capacitor (CP) 326B and a second terminal of a resistor (NPD) 328B. The drain of the NMOSFET (M2) 324B is electrically connected to a ground (GND) 304A. The gate of the NMOSFET (M2) 324B is electrically connected to a first terminal of the capacitor (CO) 326B and the N-Pre-driver circuitry 332B, particularly the source of the NMOSFET (M8). In operation, a second current (IDN) 384 may flow through resistor (RPD) 328A when, among other things, the NMOSFET (M2) 324B is conducting.

IO 210 is electrically connected to the second terminal of resistor (RPD) 328A and the first terminal of resistor (RND) 328B. The resistor (RPD) 328A and resistor (RND) 328B may be used to reduce drive current and reduce the drive current spread at the IO pad of IO 210. At the IO pad of IO 210, the external device will have a capacitance, which is illustrated as IO capacitor 306. Additionally or alternative, the capacitor (CP) 326A and the capacitor (CN) 326B reduce the rise and fall times for the P-driver circuitry 332A and the N-driver circuitry 332B, respectively.

In various embodiments, PMOSFET (M1) 324A may be a first MOSFET, FET, or transistor of the driver circuitry 220 and the NMOSFET (M2) may be a second MOSFET, FET, or transistor of the driver circuitry 220. The capacitor (CP) 326A may be a first capacitor and capacitor (CN) 326B may be a second capacitor of driver circuitry 220. In various embodiments, the first capacitor (CP) 326A and the capacitor (CN) 326B may be Miller capacitors, such as a first Miller capacitor and a second Miller capacitor, respectively. The resistor (RPD) 328A may be a first resistor and resistor (NPD) 328B may be a second resistor of driver circuitry 220.

In operation, for the P-driver circuitry 332A, the current IDP 382 will drive the charge and discharge of the capacitor (CP) 326A. The charge and discharge of the capacitor (CP) 326A will also be driven by the PD signal from the P-pre-driver circuitry 332A, which will drive the rise and fall times of the transitions for the IO 210.

In operation, for the N-driver circuitry 332B, the current IDN 384 will drive the charge and discharge of the capacitor (CN) 326B. The charge and discharge of the capacitor (CN) 326B will also be driven by the ND signal from the N-pre-driver circuitry 332B, which will drive the rise and fall times of the transitions for the IO 210.

Each of capacitor (CP) 326A and capacitor (CN) 326B reduces the spread of the rise and fall times of an IO data signal transmitted to IO 210.

In various embodiments IO loads with lower capacitances (e.g., capacitor (CIO) 306 at 10 pF), the driver capacitors assist with IO loads at lower capacitances (e.g., 10 pF) by increasing the speed of rise and fall times. The capacitance of these driver capacitors will be lower due to coupling and also due to the signal transition being faster, which is associated with a slower PD signal 372 and/or slower ND signal 374. At the lower capacitances of the load at IO 210, the respective PD signal 372 and/or ND signal 374 have slower transition times.

In various embodiments IO loads with higher capacitances (e.g., capacitor (CIO) 306 at 50 pF), the driver capacitors assist with IO loads at higher capacitances (e.g., 50 pF) by slowing the speed of rise and fall times than when compared to IO loads with lower capacitances. These capacitors will lower coupling with the respective PD signal 372 or ND signal 374. Thus the PD signal 372 or ND signal 374 will behave without being slowed.

In various embodiments, the PD signal 372 and the ND signal 374 may vary as the signal of the IO 210 varies.

Various embodiments may also include omitting additional current to or from the IO 210 and, thus, there is no additional current leakage from the IO pad or IO terminal at IO 210.

Each of the P-driver circuitry 322A and the N-driver circuitry 322B are electrically connected to a respective portion of the pre-driver circuitry 230. The pre-driver circuitry 230 may include a P-pre-driver circuitry 332A and N-pre-driver circuitry 322B. As illustrated, the P-driver circuitry 322A is electrically connected to the P-pre-driver circuitry 332A and the N-driver circuitry 322B is electrically connected to the N-pre-driver circuitry 322B.

The P-pre-driver circuitry 332A may include a PMOSFET and two NMOSFETS. For example, the P-pre-driver circuitry 332A may include PMOSFET (M3) 334A, NMOSFET (M4) 334B, and NMOSFET (M5) 334C.

In the P-pre-driver circuitry 322A, The source of PMOSFET (M3) 334A may be electrically connected to a voltage supply (302B). The drain of PMOSFET (M3) 334A may be electrically connected to the source of NMOSFET (M4)

334B and also to the P-driver circuitry 322A, which may be to transmit the PD signal 372 to the P-driver circuitry 322A. The gate of the PMOSFET (M3) 334A and the gate of the NMOSFET (M4) 334B may be electrically connected together and to the data processing circuitry 260, which may transmit a signal P-pre-driver signal 266 to the P-pre-driver circuitry 332A at this electrical connection. The drain of the NMOSFET (M4) 334B may be electrically connected to the source of the NMOSFET (M5) 334C. The drain of the NMOSFET (M5) 334C may be electrically connected to a ground (GND) 304B. The gate of the NMOSFET (M5) 334C may be electrically connected to the PVT compensated current sink circuitry 240, which may to transmit a P-pre-driver compensation signal 242 to the P-pre-driver circuitry 332A.

The N-pre-driver circuitry 332B may include a NMOS-FET and two PMOSFETS. For example, the P-pre-driver circuitry 332B may include NMOSFET (M6) 334D, NMOSFET (M7) 334E, and PMOSFET (M8) 334F.

In the N-pre-driver circuitry 322B, The source of PMOS-FET (M6) 334D may be electrically connected to a voltage supply (302C). The drain of PMOSFET (M6) 334D may be electrically connected to the source of PMOSFET (M7) 334E. The gate of the PMOSFET (M6) 334D may be electrically connected to the PVT compensated current source circuitry 250, which may to transmit a N-pre-driver compensation signal 252 to the N-pre-driver circuitry 332B. The drain of the PMOSFET (M7) 334E may be electrically connected to the source of the NMOSFET (M8) 334F and also to the N-driver circuitry 322B, which may be to transmit the ND signal 374 to the N-driver circuitry 322B. The gate of the PMOSFET (M7) 334E and the gate of the NMOSFET (M8) 334F may be electrically connected together and to the data processing circuitry 260, which may transmit a signal N-pre-driver signal 268 to the N-pre-driver circuitry 332B at this electrical connection. The drain of the NMOSFET (M8) 334F may be electrically connected to a ground (GND) 304C.

In various embodiments, voltage supplies 302A, 302B, and 302C may be the same voltage supply, different voltage supplies, and/or different terminals to the same voltage supply. The grounds 304A, 304B, and 304C may similar be the same ground, different grounds, and or different terminals to the same ground.

A P-pre-driver signal 266 may be generated by the data processing circuitry 260 to control the P-pre-driver circuitry 332A in generating the PD signal 372. A N-pre-driver signal 268 may be generated by the data processing circuitry 260 to control the N-pre-driver circuitry 332B in generating the NPD signal 374.

In various embodiments, the data processing circuitry 260 may provide a first enable signal 262 to the PVT compensated current sink circuitry 240 and a second enable signal 264 to the PVT compensated current source circuitry. The first enable signal 262 and the second enable signal 264 may enable and/or disable the respective PVT compensated current sink circuitry 240 and PVT compensated current source circuitry 250, such as through a switch. When enabled, the PVT compensated current sink circuitry 240 may compensated and/or control the PD signal 372 as described herein. When enabled, the PVT compensated current source circuitry 250 may compensated and/or control the ND signal 374 as described herein.

FIG. 4A illustrates a block diagram of a PVT compensated current sink circuitry 240 in accordance with one or more embodiments of the present disclosure. The PVT compensated current sink circuitry 240 may include a current sink 442 and four transistors. The four transistors may be a PMOSFET (M9) 444A, a PMOSFET (M10) 444B, a PMOSFET (M11) 444C, and a NMOSFET (M12) 444D. The PVT compensated current sink circuitry 240 may also include a switch 446 that is controlled by a first enable signal 262. The first enable signal 262 may control switch 446 to switch between connecting the gate of PMOSFET (M9) 444A between a ground (e.g., 404) and a voltage supply (not illustrated). To disable PMOSFET (M9) the gate of PMOS-FET (M9) may be switched to be electrically connected to a voltage supply (e.g., voltage supply (VDD) 402A).

As illustrated in FIG. 4A, the current sink 442 is electrically connected to the drain of PMOSFET (M9) 444A. The drain of the PMOSFET (M9) 444A is also electrically connected to the gates of the PMOSFET (M10) 444B and the PMOSFET (M11) 444C. The source of the PMOSFET (M9) 444A is electrically connected to a voltage supply (VDD) 402A. The sources of PMOSFET (M10) 444B and PMOSFET (M11) are electrically connected to respective voltage supplies (VDD) 402B and 402C. The drain of PMOSFET 402B is electrically connected to the drain of PMOSFET (M9) 444A, the first terminal of the current sink 442, and the gates of PMOSFET (M10) 444B and PMOS-FET (M11) 444C. The drain of PMOSFET (M11) 444C is electrically connected to the source and the gate of NMOS-FET (M12) 444D as well as to the pre-driver circuitry 230 to transmit P-pre-driver compensation signal 242. The drain of NMOSFET (M12) 444D is electrically connected to a ground (GND) 404B.

In operation, the PVT compensated current sink circuitry 240 may receive first enable signal 262. The first enable signal 262 may cause the switch 446 to electrically connect to a ground. The connection to the ground may operate to cause the four transistors to operate with the current sink 442 to generate current IVP 496 from the source to the drain of PMOSFET (M9) 444A and current IBP 492A from the drain of PMOSFET (M10) 444B. The current IBP 492A is the same as current IBP 492B, which is also the same value as current IBP 392, which is due to P-pre-driver compensation signal 242 provided to the pre-driver circuitry 230. Thus the PVT compensated current sink circuitry 240 compensated the pre-driver circuitry 230, specifically the P-pre-driver circuitry 332A, which thus compensates the PD signal 372.

FIG. 4B illustrates a block diagram of a PVT compensated current sink circuitry 250 in accordance with one or more embodiments of the present disclosure. The PVT compensated current source circuitry 250 may include a current source 444 and four transistors. The four transistors may be a NMOSFET (M13) 454A, a NMOSFET (M14) 454B, a NMOSFET (M15) 454C, and a PMOSFET (M16) 454D. The PVT compensated current source circuitry 250 may also include a switch 456 that is controlled by a second enable signal 264. The second enable signal 264 may control switch 456 to switch between connecting the gate of NMOS-FET (M13) 454A between a voltage supply (e.g., 402F) and a ground (not illustrated). To disable NMOSFET (M13) the gate of NMOSFET (M13) may be switched to be electrically connected to ground (e.g., ground (GND) 404C).

As illustrated in FIG. 4B, a first terminal of current source 444 is electrically connected to a voltage supply (VDD) 402D. A second terminal of current source 444 is electrically connected to the source of NMOSFET (M13) 454A, the source of NMOSFET (M14) 454B, the gate of NMOSFET (M14) 454B, and the gate of NMOSFET (M15) 454C. The drain of NMOSFET (M13) 454A is electrically connected to a ground (GND) 404C. The drain of NMOSFET (M14) 454B is electrically connected to a ground (GND) 404D.

The drain of NMOSFET (M15) 454C is electrically connected to a ground (GND) 404E. The source of the PMOSFET (M16) 454D is electrically connected to a voltage supply (VDD) 402E. The gate and source of PMOSFET (M16) 454D are electrically connected to the source of NMOSFET (M15) 454C as well as to pre-driver circuitry 230 to transmit N-pre-driver compensation signal 252.

In operation, the PVT compensated current source circuitry 250 may receive second enable signal 264. The second enable signal 264 may cause the switch 448 to electrically connect to a voltage supply (VDD) 402F. The connection to the voltage supply may operate to cause the four transistors to operate with the current source 444 to generate current IVN 498 from the drain of NMOSFET (M13) 454A and current IBN 492A to the source of NMOSFET (M14) 454B and gates of NMOSFET (M14) 454B and NMOSFET (M15) 454C. The current IBN 494A is the same as current IBN 494B, which is also the same value as current IBN 394, which is due to N-pre-driver compensation signal 252 provided to the pre-driver circuitry 230. Thus the PVT compensated current source circuitry 250 compensated the pre-driver circuitry 230, specifically the N-pre-driver circuitry 332B, which thus compensates the ND signal 374.

In various embodiments the PVT compensation circuitry may compensate for process, voltage, and temperature. The compensation circuitry 230 may reduce the spread of PD signal 372 and the ND signal 374 and, thus, the rise and fall times of the IO 210 may be reduced.

In various embodiments, the process may range from a fast process to a slow process. A fast process may be a process with a transition time of input output delay and propagation delay that is a minimum or lower than other processes. A slow process may be a process with a transition time of input/output delay and propagation delay that is a maximum or higher than other processes.

When a process is fast, IVP 496 in the PVT compensated current sink circuitry 240 and IVN 498 in the PVT compensated current sink circuitry 250 may be larger, which decreases IBP 492A and IBN 494A respectively. As IBP 492A is lowered then IBP 392 of pre-driver circuitry 230 is also lowered. Similarly, as IBN 494A is lowered then IBN 394 of pre-driver circuitry 230 is also lowered.

When a process is slow, IVP 496 in the PVT compensated current sink circuitry 240 and IVN 498 in the PVT compensated current source circuitry 250 may be lower, which increases IBP 492A and IBN 494A respectively. As IBP 492A is increased then IBP 392 of pre-driver circuitry 230 is also increased. Similarly, as IBN 494A is increased then IBN 394 of pre-driver circuitry 230 is also increased.

In various embodiments the voltage may change and the compensation circuitries (e.g., 240, 250) may compensate for the change in voltage. For example, in various embodiments the voltage may fluctuate between 1.68V and 1.98V. With the compensation from the compensation circuitries (e.g., 240, 250), when the voltage supply 302 goes down then the currents in the driver circuitry 220 (e.g, current IDP 382 and current IDN 384) through the associated resistors (e.g., resistor (RPD) 328A and resistor (RND) 328B) will go down. The reduction in the current will cause the current in the in the pre-driver circuitry 502 (e.g., current IBP 392 and current IBN 394) to be reduced.

When voltage increases or is at a max voltage, IVP 496 in the PVT compensated current sink circuitry 240 and IVN 498 in the PVT compensated current sink circuitry 250 may be larger, which decreases IBP 492A and IBN 494A respectively. As IBP 492A is lowered then IBP 392 of pre-driver circuitry 230 is also lowered. Similarly, as IBN 494A is lowered then IBN 394 of pre-driver circuitry 230 is also lowered.

When voltage decreases or is at a min voltage, IVP 496 in the PVT compensated current sink circuitry 240 and IVN 498 in the PVT compensated current source circuitry 250 may be lower, which increases IBP 492A and IBN 494A respectively. As IBP 492A is increased then IBP 392 of pre-driver circuitry 230 is also increased. Similarly, as IBN 494A is increased then IBN 394 of pre-driver circuitry 230 is also increased.

In various embodiments the temperature may change and the compensation circuitries (e.g., 240, 250) may compensate for the change in temperature.

For the PVT compensated current sink circuitry 240, the current of the current sink 442 compensates for the change in temperature. The current of the current sink 442 is a combination of the current IVP 496 and the current IBP 492A. The current IBP 492A is the same value as currents IBP 492B and current IBP 392 of the P-pre-driver circuitry 322A. Thus the change in temperature causing a change in the current of the current sink 442 compensates for the current IBP 392, which compensates or changes the voltage of PD signal 372. As described herein, the compensation of the PD signal 372 compensate the signal to IO 210.

For the PVT compensated current source circuitry 250, the current of the current source 444 compensates for the change in temperature. The current of the current source 444 is a combination of the current IVN 498 and the current IBN 494A. The current IBN 494A is the same value as currents IBN 494B and current IBN 394 of the N-pre-driver circuitry 322B. Thus the change in temperature causing a change in the current of the current source 444 compensates for the current IBN 394, which compensates or changes the voltage of ND signal 374. As described herein, the compensation of the ND signal 374 compensate the signal to IO 210.

In various embodiments there may be a range in temperatures to which the SPI 200 may be exposed, and the compensation circuitry may compensate for the change in temperature. For example, the temperature may change with operation of the SPI 200 and/or system or device that includes or is connected to the SPI 200. For example, the current sink 442 and/or current source 444 may compensate for a change in temperature. The compensation may be through controlling the pre-driver circuitry 230 generation of PD signal 372 and ND signal 374, which each compensates and/or changes the charging and/or discharging of the associated capacitor (CP) 326A or capacitor (CN) 326B, respectively. The charging and/or discharging of these capacitors may control the IO rise and fall times for capacitor (CIO) 306. Additionally and/or alternatively, this may be in conjunction (or not) with the resistor (RPD) 328A and resistor (RND) 328B used to reduce driver circuitry 220 process spread.

FIG. 5 illustrates a graph of an example IO signal in accordance with one or more embodiments of the present disclosure. The graph 500 is a graph of voltage over time for signals IO signal 540, PD signal 20, and ND signal 530.

As illustrated, when the PD signal 520 goes lower and the ND signal 530 goes higher, the IO signal 510 goes from low to high (e.g., zero to 1). Also when the PD signal 520 goes higher and the ND signal 530 goes lower, the IO signal 510 goes from high to low (e.g., 1 to zero). Also, when the IO 210 is high (e.g., 1) then the ND signal is low and the PD signal is high. Alternatively, when the IO 210 is low (e.g., 0) then the ND signal is high and the PD signal is low.

When P-driver circuitry 322A is on (e.g., high or 1) then the IO capacitor 306 of the load will charge. Once charged, the N-driver circuitry 332B closing will not disturb the charging of the IO capacitor (CIO) 306, which is done by the P-driver circuitry 322A as led by the PD signal 372 Thus the driver circuitry 322A may be following the PD signal 372 to slowly charge the IO capacitor (CIO) 306 slowly when the IO signal goes high.

In various embodiments, the PD signal 520 fall is not a linear fall. This reflects the behavior of the circuitry of the SPI 200 and is from the PD signal 520 being generated from one PMOSFET (e.g., 334A) and two NMOSFETs (e.g., 334B and 33C) of the P-pre-driver circuitry 332A. The rise of the ND signal 530 is not a linear rise. This reflects the behavior of the circuitry of the SPI 200 and is from the ND signal 530 being generated from two PMOSFETs (e.g., 334D and 334E) and one NMOSFET (e.g., 334F) of the N-pre-driver circuitry 332B. Thus the falling signal may faster than the rising signal in various embodiments.

FIG. 6A illustrates a graph of an example signals in accordance with one or more embodiments of the present disclosure. FIG. 6A includes a first graph 602 of voltage over time of a data signal 610 (e.g., an input signal) and a second graph 604 of voltage over time over time showing a plurality of IO signals (e.g., output IO signals). The plurality of signals in graph 604 include the rising edge and falling edge of embodiments of the present disclosure compared to SPIs without the improvements of the present disclosure.

Graph 602 illustrates a data signal 610 (e.g., an input signal) changing from low (e.g., 0) to high (e.g., 1.8) over time.

Graph 604 illustrates four signals and how they respond to an SPI with a data signal 610. Two of the signals are first signal 622 and second signal 624, which are associated with SPIs that do not include embodiments of the present disclosure. Two of the signals associated with embodiments of the present disclosure include third signal 632 and fourth signal 634. The first signal 622 and the second signal 624 illustrate the spread of rise time of the data signal 610 across all corners in accordance with the present disclosure. The third signal 632 and fourth signal 634 illustrate the spread of the rise time across all corners in accordance with the present disclosure.

As illustrated in graph 604, the rising edge of signal 622 is faster than signal 632 and the rising edge of 634 is faster than signal 624. As is also illustrated in graph 604, the falling edge of signal 622 is faster than signal 632 and the falling edge of 634 is faster than signal 624.

FIG. 6B illustrates an enlargement of a graph of an example signals in accordance with one or more embodiments of the present disclosure. FIG. 6B is provided to better illustrate the distinction between the four signals of graph 604. FIG. 6B demonstrates that embodiments in accordance with the present disclosure reduces the spread of the rise time (e.g., the difference between the minimum rise time and the maximum rise time) and reduces the propagation rise delay (and vice versa for fall time and fall delay).

In various embodiments, the IO capacitor (CIO) 306 may range may be from 10 pF to 50 pF, an IO signal may be at a frequency of 27 MHz, and a supply voltage 302 may vary from 1.62V to 1.98V. With various embodiments of the present disclosure, the PVT compensation circuits of the of the PVT compensated current sink circuitry 240 and PVT compensated current source circuitry 250 may be used to slow a minimum transition time to 1.68 ns, which may be a slowing of up to three times or 3×. This increase in transition time may allow for using a transmission line (TL) of up to 4 inches (which may be an increase from 0.66 inches). The longer TL is due to the frequency at 27 MHz not attenuating as quickly. The increase in TL allows for, for example, longer circuit traces. This allows for larger circuits to be built. Additionally or alternatively, in various embodiments the static pad leakage of the IO 210 may also not increase.

It should be readily appreciated that the embodiments of the systems and apparatuses, described herein may be configured in various additional and alternative manners in addition to those expressly described herein.

Exemplary Methods

FIG. 7 illustrates a flowchart that includes example methods for operating an SPI in accordance with one or more embodiments of the present disclosure.

At operation 702, one or more enable signals are generated. The data processing circuitry 260 may be operated to generate one or more enable signals of a first enable signal 262 and/or a second enable signal 264. The first enable signal 262 may be transmitted to a PVT compensated current sink circuitry 240. The second enable signal 264 may be transmitted to a PVT compensated current source circuitry 250.

At operation 704, one or more PVT compensation circuits are enabled. The PVT compensation current sink circuitry 240 may be enable from a first enable signal 262 received from the data processing circuitry 260. The enable signal 262 may cause a switch 446 to operate to allow the PVT compensation current sink circuitry 240 to generate a first enable signal 262.

The PVT compensation current source circuitry 250 may be enable from a second enable signal 264 received from the data processing circuitry 260. The second enable signal 264 may cause a switch 456 to operate to allow the PVT compensation current sink circuitry 240 to generate a first enable signal 262.

At operation 706, one or more compensation currents are generated. After being enabled, the PVT compensation current sink circuitry 240 may generate a P-pre-driver compensation signal 242 that is transmitted to the P-pre-driver circuitry 332A. After being enabled, the PVT compensation current source circuitry 250 may generate a N-pre-driver compensation signal 252 that is transmitted to the N-pre-driver circuitry 332B.

At operation 708, a PD signal and/or ND signal is generated. After receiving the P-pre-driver compensation signal 242 and a P-pre-driver signal 266, the P-pre-driver circuitry 332A generates a PD signal 372. After receiving the N-pre-driver compensation signal 252 and a N-pre-driver signal 268, the N-pre-driver circuitry 332A generates a ND signal 374.

At operation 710, compensated IO signal(s) are generated. After receiving the PD signal 372 and/or ND signal 374, the driver circuitry 220 generates a compensated IO data signal that is transmitted to IO 210.

It will be appreciated that if the PVT compensation circuitries are exposed to a change in process, voltage, and/or temperature then the PVT compensation circuits may generate one or more compensated, adjusted, or new compensation currents (e.g., IBP 492A, IBN 494A), which will compensate the PD signal 372 and/or ND signal 374, which will compensate and/or adjust the compensated IO signal to IO 210.

Exemplary Systems and Apparatuses

Embodiments of the present disclosure herein include systems and apparatuses including an SPI 200 described herein, which may be implemented in various embodiments.

FIG. 8 illustrates an example block diagram of a system or apparatus in accordance with one or more embodiments of the present disclosure. Various embodiments may include systems or apparatuses of mobile devices and the SPI interface 200 may be, for example, on a semiconductor chip of a mobile device. An example of such a semiconductor chip may be a system on a chip (SOC) integrated circuit that includes an SPI 200.

The device 800 illustrated may be a system and/or apparatus that includes a processor 802, memory 804, communications circuitry 806, input/output circuitry 808, and all of which may be connected. While such connections are illustrated as bus 310, it will be readily appreciated that there may be multiple other connections.

The processor 802, although illustrated as a single block, may be comprised of a plurality of components and/or processor circuitry. The processor 802 may be implemented as, for example, various components comprising one or a plurality of microprocessors with accompanying digital signal processors; one or a plurality of processors without accompanying digital signal processors; one or a plurality of coprocessors; one or a plurality of multi-core processors; processing circuits; and various other processing elements. The processor may include integrated circuits. In various embodiments, the processor 802 may be configured to execute applications, instructions, and/or programs stored in the processor 802, memory 804, or otherwise accessible to the processor 802. When executed by the processor 802, these applications, instructions, and/or programs may enable the execution of one or a plurality of the operations and/or functions described herein. Regardless of whether it is configured by hardware, firmware/software methods, or a combination thereof, the processor 802 may comprise entities capable of executing operations and/or functions according to the embodiments of the present disclosure when correspondingly configured.

The memory 804 may comprise, for example, a volatile memory, a non-volatile memory, or a certain combination thereof. Although illustrated as a single block, the memory 804 may comprise a plurality of memory components. In various embodiments, the memory 804 may comprise, for example, a random access memory, a cache memory, a flash memory, a hard disk, a circuit configured to store information, or a combination thereof. The memory 804 may be configured to write or store data, information, application programs, instructions, etc. so that the processor 802 may execute various operations and/or functions according to the embodiments of the present disclosure. For example, in at least some embodiments, a memory 804 may be configured to buffer or cache data for processing by the processor 802. Additionally or alternatively, in at least some embodiments, the memory 804 may be configured to store program instructions for execution by the processor 802. The memory 804 may store information in the form of static and/or dynamic information. When the operations and/or functions are executed, the stored information may be stored and/or used by the processor 802.

The communication circuitry 806 may be implemented as a circuit, hardware, computer program product, or a combination thereof, which is configured to receive and/or transmit data from/to another component or apparatus. The computer program product may comprise computer-readable program instructions stored on a computer-readable medium (e.g., memory 804) and executed by a processor 802. In various embodiments, the communication circuitry 806 (as with other components discussed herein) may be at least partially implemented as part of the processor 802 or otherwise controlled by the processor 802. The communication circuitry 806 may communicate with the processor 802, for example, through a bus 810. Such a bus 810 may connect to the processor 802, and it may also connect to one or more other components of the processor 802. The communication circuitry 806 may be comprised of, for example, transmitters, receivers, transceivers, network interface cards and/or supporting hardware and/or firmware/software, and may be used for establishing communication with another component(s), apparatus(es), and/or system(s). The communication circuitry 806 may be configured to receive and/or transmit data that may be stored by, for example, the memory 804 by using one or more protocols that can be used for communication between components, apparatuses, and/or systems.

In various embodiments, the communication circuitry 806 may be an SPI 200 as described herein that may be connected to one or more external devices via the SPI 200.

The input/output circuitry 808 may communicate with the processor 802 to receive instructions input by an operator and/or to provide audible, visual, mechanical, or other outputs to an operator. The input/output circuitry 808 may comprise supporting devices, such as a keyboard, a mouse, a user interface, a display, a touch screen display, lights (e.g., warning lights), indicators, speakers, and/or other input/output mechanisms. The input/output circuitry 808 may comprise one or more interfaces to which supporting devices may be connected. In various embodiments, aspects of the input/output circuitry 808 may be implemented on a device used by the operator to communicate with the processor 802. The input/output circuitry 508 may communicate with the memory 804, the communication circuitry 806, and/or any other component, for example, through a bus 810.

It should be readily appreciated that the embodiments of the systems and apparatuses, described herein may be configured in various additional and alternative manners in addition to those expressly described herein.

Conclusion

Operations and/or functions of the present disclosure have been described herein, such as in flowcharts. As will be appreciated, computer program instructions may be loaded onto a computer or other programmable apparatus (e.g., hardware) to produce a machine, such that the resulting computer or other programmable apparatus implements the operations and/or functions described in the flowchart blocks herein. These computer program instructions may also be stored in a computer-readable memory that may direct a computer, processor, or other programmable apparatus to operate and/or function in a particular manner, such that the instructions stored in the computer-readable memory produce an article of manufacture, the execution of which implements the operations and/or functions described in the flowchart blocks. The computer program instructions may also be loaded onto a computer, processor, or other programmable apparatus to cause a series of operations to be performed on the computer, processor, or other programmable apparatus to produce a computer-implemented process such that the instructions executed on the computer, processor, or other programmable apparatus provide operations for implementing the functions and/or operations specified in the flowchart blocks. The flowchart blocks support combinations of means for performing the specified operations and/or functions and combinations of operations and/or functions for performing the specified operations and/or functions. It will be understood that one or more blocks of the flowcharts, and combinations of blocks in the flowcharts, can be implemented by special purpose hardware-based computer systems which perform the specified operations and/or functions, or combinations of special purpose hardware with computer instructions.

While this specification contains many specific embodiments and implementation details, these should not be construed as limitations on the scope of any disclosures or of what may be claimed, but rather as descriptions of features specific to particular embodiments of particular disclosures. Certain features that are described herein in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

While operations and/or functions are illustrated in the drawings in a particular order, this should not be understood as requiring that such operations and/or functions be performed in the particular order shown or in sequential order, or that all illustrated operations be performed, to achieve desirable results. In certain circumstances, operations and/or functions in alternative ordering may be advantageous. In some cases, the actions recited in the claims may be performed in a different order and still achieve desirable results. Thus, while particular embodiments of the subject matter have been described, other embodiments are within the scope of the following claims.

While this detailed description has set forth some embodiments of the present invention, the appended claims cover other embodiments of the present invention which differ from the described embodiments according to various modifications and improvements.

Within the appended claims, unless the specific term "means for" or "step for" is used within a given claim, it is not intended that the claim be interpreted under 35 U.S.C. § 112, paragraph 6.

The invention claimed is:

1. A serial peripheral interface comprising:
a driver circuitry comprising a P-driver circuitry and a N-driver circuitry;
wherein the P-driver circuitry comprises a first PMOSFET electrically connected to a voltage supply at a source of the first PMOSFET and to a first terminal of a first resistor and a first terminal of a first capacitor at a drain of the first PMOSFET, wherein a second terminal of the first capacitor is electrically connected to a gate of the first PMOSFET;
wherein the N-driver circuitry comprises a first NMOSFET electrically connected to a first terminal of a second resistor and a first terminal of second capacitor at a source of the first NMOSFET and to a ground at a drain of the first NMOSFET, wherein a second terminal of the second capacitor is electrically connected to a gate of the first NMOSFET;
wherein the second terminal of the first resistor is electrically connected to a second terminal of the second resistor and an input/output terminal;
a pre-driver circuitry comprising a P-pre-driver circuitry electrically connected to the gate of the first PMOSFET and a N-pre-driver circuitry electrically connected to the gate of the first NMOSFET, wherein the P-pre-driver circuitry is configured to generate a first PD signal and to transmit the first PD signal to the gate of the first PMOSFET, wherein the N-pre-driver circuitry is configured to generate a first ND signal and to provide the first ND signal to the gate of the first NMOSFET;
a PVT compensated current sink circuitry electrically connected to the P-pre-driver circuitry; and
a PVT compensated current source circuitry electrically connected to the N-pre-driver circuitry.

2. The serial peripheral interface of claim 1, wherein the PVT compensated current sink circuitry is configured to generate a first current, wherein the P-pre-driver circuitry is configured to generate a second current that is equal to the first current.

3. The serial peripheral interface of claim 2, wherein the first PD signal is generated based at least on the second current.

4. The serial peripheral interface of claim 1, wherein the PVT compensated current source circuitry is configured to generate a third current, wherein the N-pre-driver circuitry is configured to generate a fourth current that is equal to the third current.

5. The serial peripheral interface of claim 4, wherein the first ND signal is generated based at least on the fourth current.

6. The serial peripheral interface of claim 1, wherein the PVT compensated current sink circuitry is configured to receive a first enable signal to control a first switch to enable the PVT compensated current sink circuitry; and
wherein the PVT compensated current source circuitry is configured to receive a second enable signal to control a second switch to enable the PVT compensated current source circuitry.

7. The serial peripheral interface of claim 1, wherein the PVT compensated current sink circuitry is configured to generate a first current with a higher current value when a voltage of a voltage supply increases.

8. An apparatus comprising:
a serial peripheral interface comprising:
a driver circuitry comprising a P-driver circuitry and a N-driver circuitry;
wherein the P-driver circuitry comprises a first PMOSFET electrically connected to a voltage supply at a source of the first PMOSFET and to a first terminal of a first resistor and a first terminal of a first capacitor at a drain of the first PMOSFET, wherein a second terminal of the first capacitor is electrically connected to a gate of the first PMOSFET;
wherein the N-driver circuitry comprises a first NMOSFET electrically connected to a first terminal of a second resistor and a first terminal of second capacitor at a source of the first NMOSFET and to a ground at a drain of the first NMOSFET, wherein a second terminal of the second capacitor is electrically connected to a gate of the first NMOSFET;
wherein the second terminal of the first resistor is electrically connected to a second terminal of the second resistor and an input/output terminal;
a pre-driver circuitry comprising a P-pre-driver circuitry electrically connected to the gate of the first PMOSFET and a N-pre-driver circuitry electrically connected to the gate of the first NMOSFET, wherein the P-pre-driver circuitry is configured to generate a first PD signal and to transmit the first PD signal to the gate of the first PMOSFET, wherein the N-predriver circuitry is configured to generate a first ND signal and to provide the first ND signal to the gate of the first NMOSFET;

a PVT compensated current sink circuitry electrically connected to the P-pre-driver circuitry;

a PVT compensated current source circuitry electrically connected to the N-pre-driver circuitry; and a processor configured to enable and to disable the PVT compensated current sink circuitry and the PVT compensated current source circuitry.

9. The apparatus of claim 8, wherein the PVT compensated current sink circuitry is configured to generate a first current, wherein the P-pre-driver circuitry is configured to generate a second current that is equal to the first current.

10. The apparatus of claim 9, wherein the first PD signal is generated based at least on the second current.

11. The apparatus of claim 8, wherein the PVT compensated current source circuitry is configured to generate a third current, wherein the N-pre-driver circuitry is configured to generate a fourth current that is equal to the third current.

12. The apparatus of claim 11, wherein the first ND signal is generated based at least on the fourth current.

13. The apparatus of claim 8, wherein the PVT compensated current sink circuitry is configured to receive an enable signal to control a first switch to enable the PVT compensated current sink circuitry; and wherein the PVT compensated current source circuitry is configured to receive a second enable signal to control a second switch to enable the PVT compensated current source circuitry.

14. The apparatus of claim 8, wherein the PVT compensated current sink circuitry is configured to generate a first current with a higher current value when a voltage of a voltage supply increases.

15. A method of operating a circuit having a serial peripheral interface comprising:

providing a serial peripheral interface comprising:

a driver circuitry comprising a P-driver circuitry and a N-driver circuitry;

wherein the P-driver circuitry comprises a first PMOSFET electrically connected to a voltage supply at a source of the first PMOSFET and to a first terminal of a first resistor and a first terminal of a first capacitor at a drain of the first PMOSFET, wherein a second terminal of the first capacitor is electrically connected to a gate of the first PMOSFET;

wherein the N-driver circuitry comprises a first NMOSFET electrically connected to a first terminal of a second resistor and a first terminal of second capacitor at a source of the first NMOSFET and to a ground at a drain of the first NMOSFET, wherein a second terminal of the second capacitor is electrically connected to a gate of the first NMOSFET;

wherein the second terminal of the first resistor is electrically connected to a second terminal of the second resistor and an input/output terminal;

a pre-driver circuitry comprising a P-pre-driver circuitry electrically connected to the gate of the first PMOSFET and a N-pre-driver circuitry electrically connected to the gate of the first NMOSFET;

a PVT compensated current sink circuitry electrically connected to the P-pre-driver circuitry;

a PVT compensated current source circuitry electrically connected to the N-pre-driver circuitry;

generating, by the P-pre-driver circuitry and based at least on a first enable signal, a first PD signal;

generating, by the N-pre-driver circuitry and based at least on a second enable signal, a first ND signal; and generating, by the driver circuitry and based on the first PD signal and the first ND signal, a first input/output signal at the input/output terminal.

16. The method of claim 15 further comprising:

generating, by the PVT compensated current sink circuitry, a first current;

generating, by the P-pre-driver circuitry, a second current that is equal to the first current; and wherein the first PD signal is generated based at least on the second current.

17. The method of claim 15 further comprising:

generating, by the PVT compensated current source circuitry, a third current;

generating, by the N-pre-driver circuitry, a fourth current that is equal to the third current; and wherein the first ND signal is generated based at least on the fourth current.

18. The method of claim 16, wherein generating the first current is based at least on a compensation for a change in process.

19. The method of claim 16, wherein generating the first current is based at least on a compensation for a change in voltage.

20. The method of claim 16, wherein generating the first current is based at least on a compensation for a change in temperature.

* * * * *